(12) United States Patent
Yu et al.

(10) Patent No.: US 8,525,343 B2
(45) Date of Patent: Sep. 3, 2013

(54) DEVICE WITH THROUGH-SILICON VIA (TSV) AND METHOD OF FORMING THE SAME

(75) Inventors: Chen-Hua Yu, Hsinchu (TW); Wen-Chih Chiou, Miaoli (TW); Ebin Liao, Taichung (TW); Tsang-Jiuh Wu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/892,409

(22) Filed: Sep. 28, 2010

(65) Prior Publication Data
US 2012/0074582 A1    Mar. 29, 2012

(51) Int. Cl.
*H01L 23/48* (2006.01)
*H01L 23/52* (2006.01)

(52) U.S. Cl.
USPC .................... 257/774; 257/760; 257/E23.145

(58) Field of Classification Search
USPC .................................. 257/774, E23.145, 760
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,720,661 B2 * | 4/2004 | Hanaoka et al. | 257/774 |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |

(Continued)

OTHER PUBLICATIONS

Ramaswami, Sesh et al., "Process Integration Considerations for 300 mm TSV Manufacturing", IEEE Transactions on Device and Materials Reliability, vol. 9, No. 4, Dec. 2009, pp. 524-528.

(Continued)

*Primary Examiner* — Nitin Parekh
(74) *Attorney, Agent, or Firm* — Lowe Hauptman & Ham, LLP

(57) ABSTRACT

A device with through-silicon via (TSV) and a method of forming the same includes the formation of an opening in a silicon substrate, the formation of a first insulation layer on the sidewalls and bottom of the opening, the formation of a second insulation layer on the sidewalls and bottom of the opening. A first interface between the first insulation layer and the silicon substrate has an interface roughness with a peak-to-valley height less than 5 nm. A second interface between the second insulation layer and the conductive layer has an interface roughness with a peak-to-valley height less than 5 nm.

21 Claims, 8 Drawing Sheets

(56) References Cited

U.S. PATENT DOCUMENTS

| | | |
|---|---|---|
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2004/0061238 A1* | 4/2004 | Sekine ............ 257/774 |
| 2006/0001174 A1* | 1/2006 | Matsui ............ 257/774 |
| 2006/0113582 A1* | 6/2006 | Ohuchi ............ 257/309 |
| 2007/0210365 A1* | 9/2007 | Togashi et al. ...... 257/296 |
| 2008/0079112 A1 | 4/2008 | Uchiyama |
| 2009/0302430 A1* | 12/2009 | Takahashi et al. ...... 257/621 |
| 2010/0327422 A1* | 12/2010 | Lee et al. ............ 257/690 |

OTHER PUBLICATIONS

Klumpp, A., "3D-Integration of Silicon Devices: A Key Technology for Sophisticated Products", Nanomaterials, Devices and Silicon Processing, NDS, Fraunhofer Institute for Reliability and Microintegration Hansastr. 27d, 80686, Munich, Germany, 978-3-9810801-2-2, 2010.

Zhang, Wiaowu et al., "Development of Through Silicon Via (TSV) Interposer Technology for Large Die (21x21mm) Fine-pitch Cu/low-k FCBGA Package", Electronic Components and Technology Conference, 2009, pp. 305-312.

Ji, Ming et al., "A New Method to Fabricate Sidewall Insulation of TSV Using a Parylene Protection Layer", International Conference on Electronic Packaging Technology & High Density Packaging (ICEPT-HDP), 2009, pp. 60-63.

* cited by examiner

DEVICE WITH THROUGH-SILICON VIA (TSV) AND METHOD OF FORMING THE SAME

TECHNICAL FIELD

This disclosure relates to integrated circuit fabrication and more particularly, to through-silicon via (TSV) fabrication.

BACKGROUND

Three-dimensional system in packaging (3D-SiP) technology is driven by the strong demand for high speed, high density, small size, and multifunctional electronic devices. Through-silicon via (TSV) interconnection is a way for 3D integration due to its shortest interconnection distance and fastest speed. To address the needs in Flip chip packaging technology, silicon (Si) interposer with TSV has emerged as a good solution to provide high writing density interconnection, minimize coefficient of thermal expansion (CTE) mismatch between the die and the interposer, and improve electrical performance due to short interconnection from chip to the substrate. There are several steps involved in TSV processes which could successfully address the limitations of packaging technologies, including via forming, sidewall insulating, via filling, wafer thinning and wafer/die stacking. TSV is electrically isolated from the substrate and from the other TSV connections by TSV sidewall insulation that also determines the TSV parasitic capacitance. To ensure the expected insulation properties with high breakdown voltage, no leakage, and no cracking, the TSV sidewall insulation needs good coverage and uniformity, lower stress, and process compatibility. However, traditional via etching process on silicon, via sidewall shows scallop-like shapes consisting of many micro-concaves, which can vary in size depending on process parameters. A series of etched "scallops" in the silicon causes uneven layer/dielectric layers and voids in the conductor-filled via. Sidewall insulation roughness is one of the challenging bottlenecks in TSV processes.

DETAILED DESCRIPTION

Figure 1:
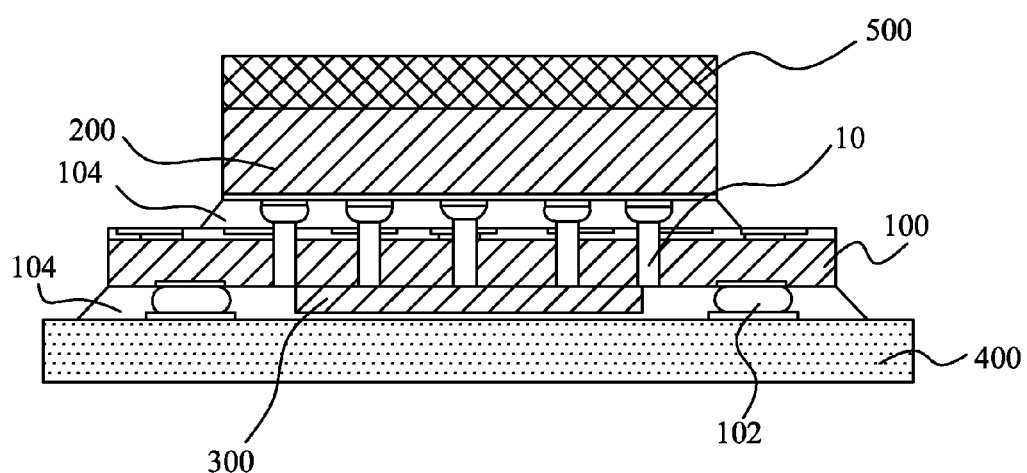
FIG. 1 is a cross-sectional diagram depicting a 3D-integrated circuit (3D-IC) device in accordance with an embodiment.

This disclosure provides embodiments of TSVs with sidewall insulation and processes of forming the same. The TSVs with sidewall insulation can be fabricated on a wafer, an integrated circuit die, an interposer or a substrate, applied to flip-chip assembly, wafer-level chip scale package (WLCSP), three-dimensional integrated circuit (3D-IC) stack, and/or any advanced package technology fields. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description is directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is a cross-sectional view of a portion of a 3D-IC device in accordance with an embodiment. A first substrate 100 is provided with a plurality of interconnect structures 10 formed therein. In one embodiment, the first substrate 100 is a silicon substrate, and the interconnect structures 10 are TSV (through-silicon via) structures 10. The silicon substrate may be an interposer or an integrated circuit die. A first die 200 is bonded to a first side of the first substrate 100, and second die 300 is bonded to a second side of the first substrate 100, forming a 3D-IC stack. The first die 200 is therefore electrically coupled to the second die 300 by at least one of the TSV structures 10. The first die 200 and the second die 300 may be any suitable integrated circuit die for a particular application. One of the first die 200 and the second die 300 is a memory chip, a logic circuit chip or a controller chip. For example, a flash memory chip, a PRAM chip, a MRAM chip, a SRAM chip, a DRAM chip, a microprocessor, a digital signal processor, and/or a microcontroller. The first substrate 100 is electrically coupled to a second substrate 400 by conductive bumps 102. An underfill material 104 is formed between the various components, e.g., the first die 200, the second die 300, the first substrate 100, and the second substrate 400. An encapsulant 500, such as a top insulating material (TIM), may also be formed over the components to protect the components from the environment and external contaminants. An additional overmold may also be formed completely encompassing some of the components.

Figure 2A:
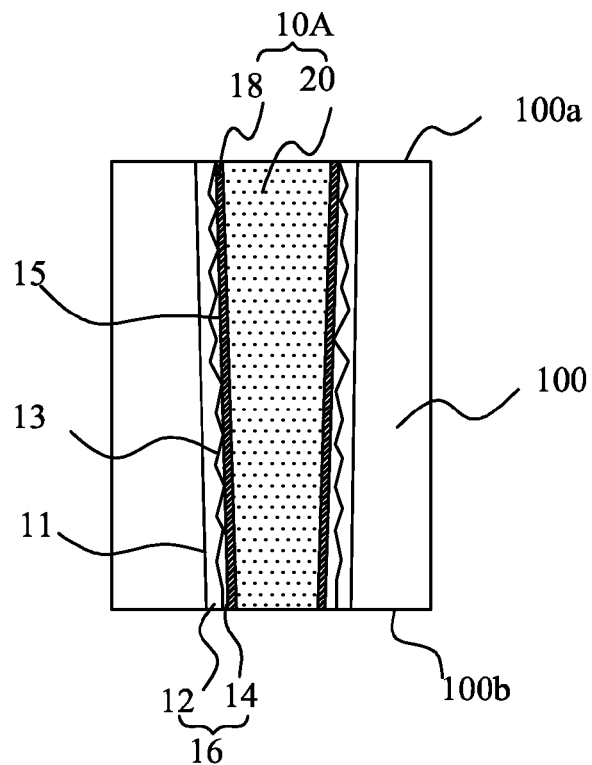
FIG. 2A is a cross-sectional view of the interconnect structure formed in the first substrate shown in FIG. 1 in accordance with an embodiment.

Illustrated in FIG. 2A is a cross-sectional view of the interconnect structure formed in the first substrate shown in FIG. 1 in accordance with an embodiment. The interconnect structure is a TSV structure 10A that is formed in the silicon substrate 100 to pass through the front surface 100a and the back surface 100b of the silicon substrate 100. The TSV structure 10A includes a conductive layer 20 and a barrier layer 18 surrounding the conductive layer 20. A sidewall insulation structure 16 is formed between the TSV structure 10A and the substrate 10 so as to isolate the TSV structure 10A from other connections. There is a first interface 11 between the sidewall insulation structure 16 and the silicon substrate 100, and a second interface 15 existed between the sidewall insulation structure 16 and the TSV structure 10A. The first interface 11 has a first interface roughness with a peak-to-valley height less than 5 nm. The second interface 15 has a second interface roughness with a peak-to-valley height less than 5 nm. The sidewall insulation structure 16 with smooth surfaces can achieve a uniform insulation thickness surrounding the TSV structure 10A. In one embodiment, sidewall insulation structure 16 has a thickness of from 50 nm to 5 um. The thickness of the sidewall insulation structure 16 can be controlled to optimize both electrical characteristics of the TSV such as capacitance and inductance. In some embodiments, the sidewall insulation structure 16 with smooth surfaces and uniform thickness reduces silicon cracks or layer cracks induced by the scalloping or rough interface. This increases process reliability at the TSV metallization step. The difficulties caused by a trade-off between insulation film quality and step-coverage and a trade-off between etch throughput and surface roughness are mitigated.

In one embodiment, the sidewall insulation structure 16 includes a first insulation layer 12 adjacent to the silicon substrate 100, and a second insulation layer 14 adjacent to the TSV structure 10A. The first interface 11 is between the first insulation layer 12 and the silicon substrate 100. The second interface 15 is between the second insulation layer 14 and the TSV structure 10A. The first insulation layer 12 and the second insulation layer 14 are formed of oxide layers by using different deposition methods. In some embodiments, the deposition of the first insulation layer 12 is carried out using a thermal oxidation process. In some embodiments, the deposition of the second insulation layer 14 is carried out using any of a variety of techniques, including SACVD (sub-atmospheric chemical vapor deposition), PECVD (plasma-enhanced chemical vapor deposition), PEALD (plasma-enhanced atomic layer deposition), and future-developed deposition procedures. Thus, the first insulation layer 12 and the second insulation layer 14 have different film properties such as different isotropic etching rates in the same solution. In one embodiment, an isotropic etching rate of the second insulation layer 14 is greater than an isotropic etching rate of the first insulation layer 12, using a dilute hydrofluoric acid (DHF) solution at room temperature. For example, using a 50:1 DHF solution, the etching rate of the thermal oxide film is about 50 Å/min, and the etching rate of the SACVD oxide film is about 300 Å/min. The wet-etching selectivity between the SACVD oxide film and the thermal oxide film may be greater than about 6 depending on the SACVD process control. A roughness of a third interface 13 can be observed between the first insulation layer 12 and the second insulation layer 14 using such a DHF etch solution. The third interface 13 has a third interface roughness with a peak-to-valley height greater than 10 nm, for example from 10 nm to 1000 nm or greater.

Figure 2B:
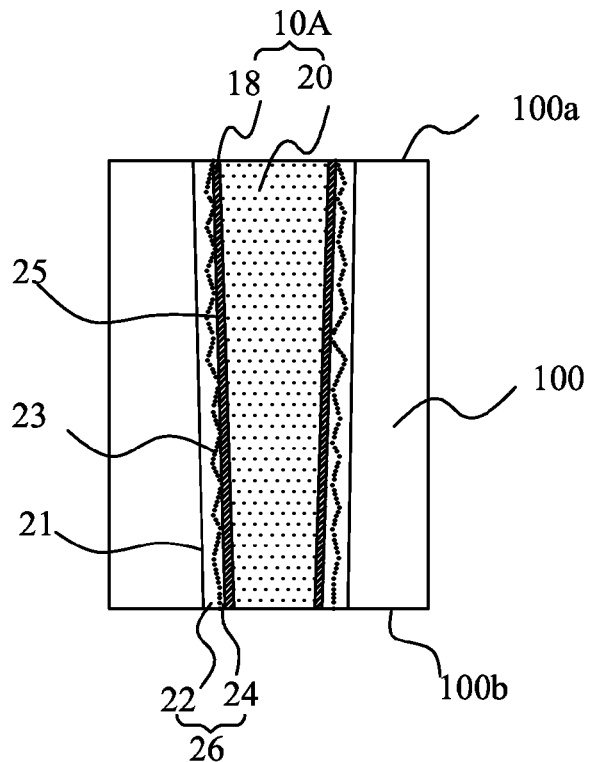
FIG. 2B is a cross-sectional view of the interconnect structure formed in the first substrate shown in FIG. 1 in accordance with an embodiment.

Illustrated in FIG. 2B is a cross-sectional view of the interconnect structure formed in the first substrate shown in FIG. 1 in accordance with another embodiment. The explanation of the same or similar portions to the description in FIG. 2A will be omitted. There is shown a TSV structure 10B formed in the silicon substrate 100 to pass through the front surface 100a and the back surface 100b of the silicon substrate 100. The TSV structure 10B includes a conductive layer 20 and a barrier layer 18 surrounding the conductive layer 20. A sidewall insulation structure 26 is formed between the TSV structure 10B and the substrate 10 so as to isolate the TSV structure 10B from other connections. There is a first interface 21 existed between the sidewall insulation structure 26 and the silicon substrate 100, and a second interface 25 existed between the sidewall insulation structure 26 and the TSV structure 10B. The first interface 21 has a first interface roughness with a peak-to-valley height less than 5 nm. The second interface 25 has a second interface roughness with a peak-to-valley height less than 5 nm. The sidewall insulation structure 26 with smooth surfaces can achieve a uniform insulation thickness surrounding the TSV structure 10B. In one embodiment, sidewall insulation structure 26 has a thickness of 50 nm-5 um. The sidewall insulation structure 26 with smooth surfaces and uniform thickness can eliminate silicon crack or layer crack induced by the scalloping or rough interface. This can increase process reliability at the TSV metallization step. The difficulties caused by a trade-off between insulation film quality and step-coverage and a trade-off between etch throughput and surface roughness could be solved.

In one embodiment, the sidewall insulation structure 26 includes a first insulation layer 22 adjacent to the silicon substrate 100, and a second insulation layer 24 adjacent to the TSV structure 10B. The first interface 21 is existed between the first insulation layer 22 and the silicon substrate 100. The second interface 25 is existed between the second insulation layer 24 and the TSV structure 10B. The first insulation layer 22 and the second insulation layer 24 are formed of oxide layers by using different deposition methods. In some embodiments, the deposition of the first insulation layer 22 is carried out using any of a variety of techniques, including SACVD (sub-atmospheric chemical vapor deposition), PECVD (plasma-enhanced chemical vapor deposition), PEALD (plasma-enhanced atomic layer deposition), and future-developed deposition procedures. In some embodiments, the second insulation layer 24 is formed by using a thermal oxidation process. During the deposition of the second insulation layer 24, the high-temperature cycles in the thermal oxidation process can improve the film properties of the first insulation layer 22 to make the two layers 22 and 24 have similar film properties, for example similar isotropic etching rates in the same solution. Thus, a third interface 23 (shown as a dotted line) between the first insulation layer 22 and the second insulation layer 24 is eliminated. In some embodiments, the two insulation layers 22 and 24 become one thermal oxide film, and it is difficult to observe the third interface 23 therein using, for example, DHF etch solution.

Figure 3:
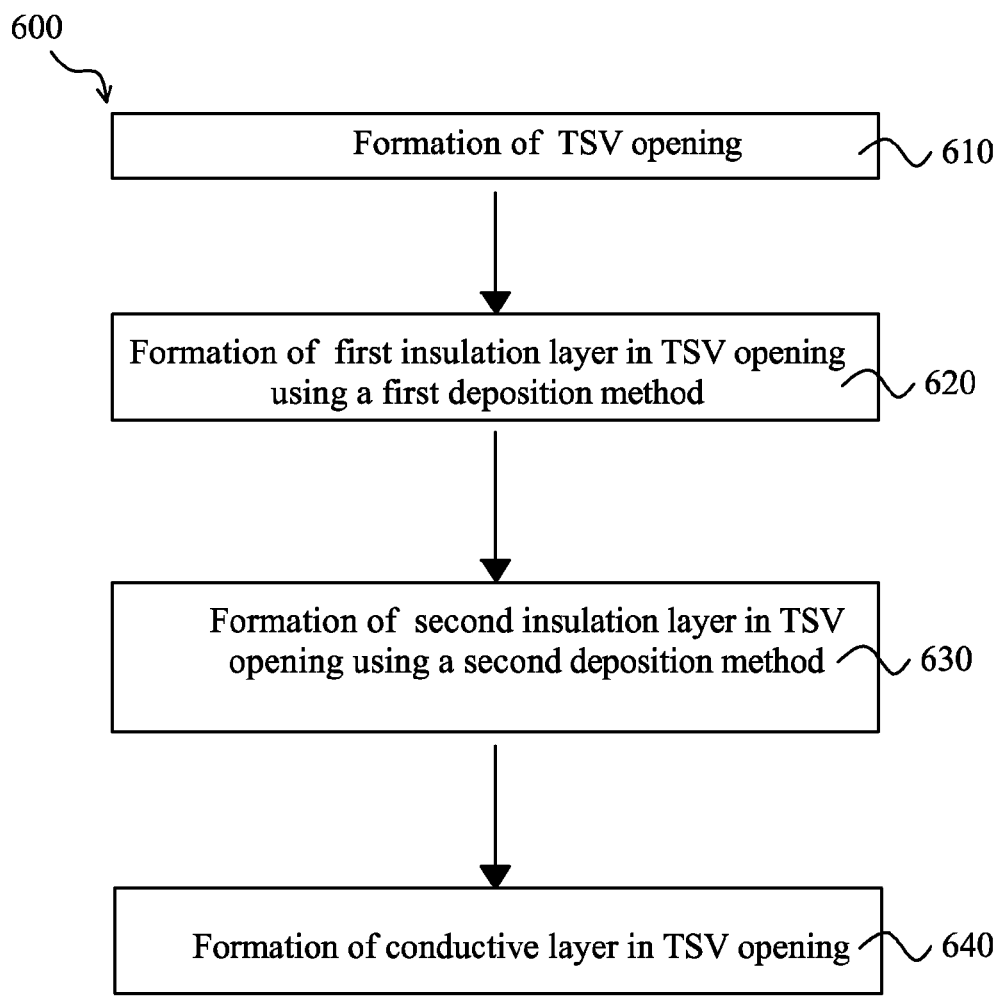
FIG. 3 is a flowchart of a method for fabricating a TSV structure according to various aspects of the present disclosure.

FIG. 3 is a flow chart of the method for fabricating a TSV structure according to various aspects of the present disclosure. The method 600 begins with block 610 in which a TSV opening is formed in a silicon substrate. The method 600 continues with block 620 in which a first insulation layer is formed in the TSV opening by a first deposition process. The first insulation layer is formed on the silicon substrate to line the bottom and sidewalls of the TSV opening. In some embodiments, the first insulation layer is an oxide layer, and the first deposition process is carried out using any of a variety of techniques, including a thermal oxidation process, SACVD, PECVD, PEALD, and future-developed deposition procedures. The method 600 continues with block 630 in which a second insulation layer is formed in the TSV opening by a second deposition process. In some embodiments, the second insulation layer is an oxide layer, and the second deposition process is carried out using any of a variety of techniques, including a thermal oxidation process, SACVD, PECVD, PEALD, and future-developed deposition procedures. The second deposition process is different from the first deposition process. The method 600 continues with block 640 in which a conductive layer is formed in the TSV opening. The conductive layer is formed to fill the TSV opening.

FIGS. 4A-4E are cross-sectional views of a portion of a wafer at various stages of its fabrication according to an embodiment of the interconnect structure of FIG. 2A and the method 600 of FIG. 3.

Figure 4A:
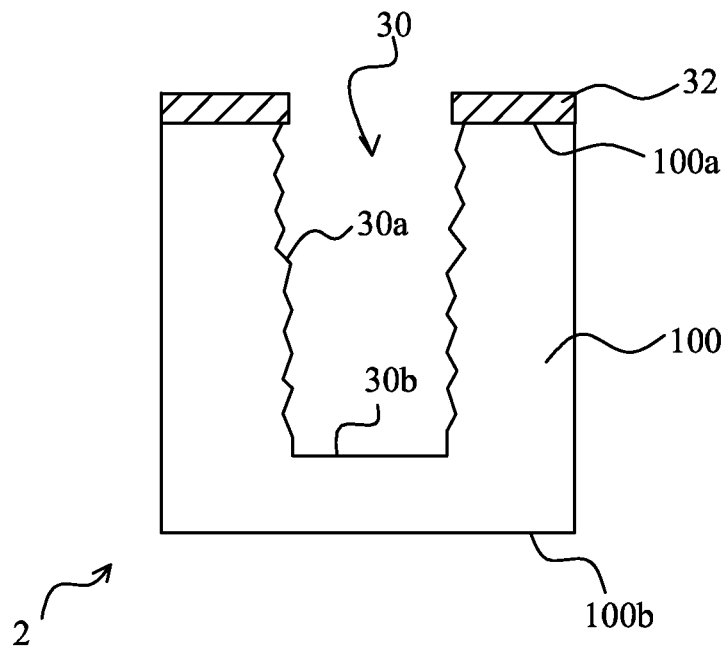
FIGS. 4A-4E are cross-sectional views of a portion of a wafer at various stages of fabrication according to an embodiment of the interconnect structure of FIG. 2A and the method of FIG. 3.
Figure 4:
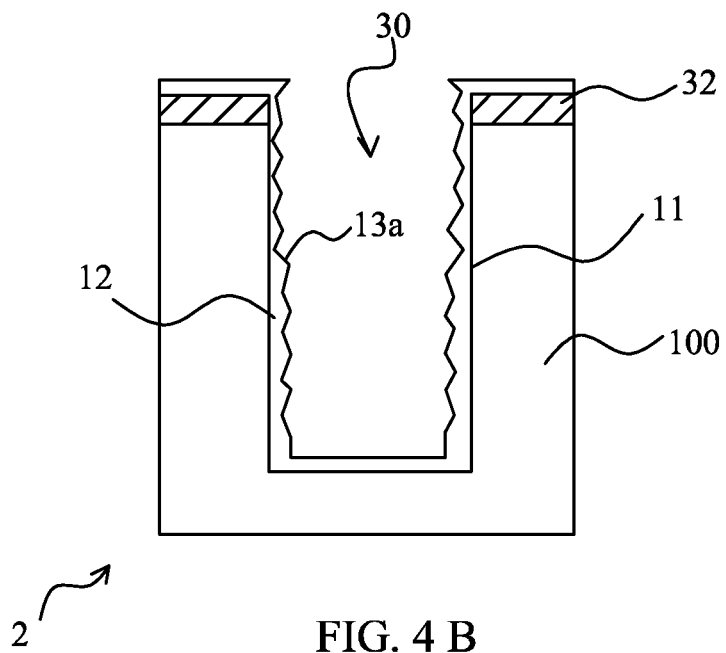
Figure 4:
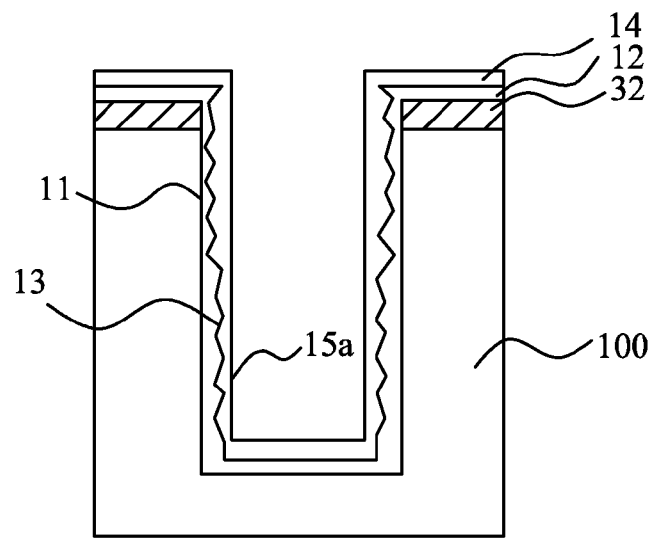
Figure 4:
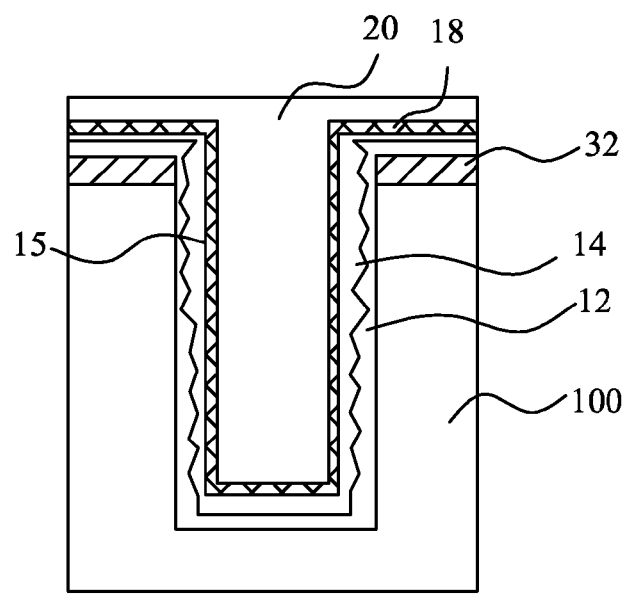
Figure 4:
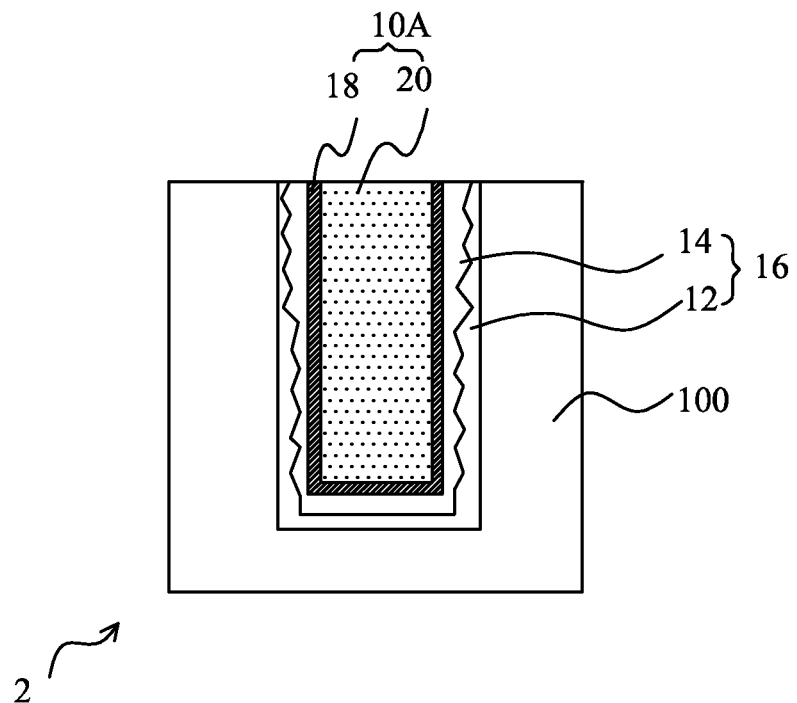

FIG. 4A is a cross-sectional diagram of a wafer 2 comprising a substrate 100. The substrate 100 has a front surface 100*a* and a back surface 100*b*. The substrate 100 may be formed of a semiconductor material, such as silicon, silicon germanium, silicon carbide, gallium arsenide, or other semiconductor materials. Alternatively, the substrate 100 is formed of a dielectric material such as silicon oxide, or the like. In one embodiment, the substrate 100 is typically silicon (Si), for example, a silicon substrate with or without an epitaxial layer, or a silicon-on-insulator substrate containing a buried insulator layer. Throughout the description, the substrate 100 and the overlying and underlying interconnect structures in combination are referred to as an interposer wafer, which is substantially free from integrated circuit devices, including active devices such as transistors and diodes. Furthermore, the interposer wafer may include, or may be free from, passive devices such as capacitors, resistors, inductors, varactors, or the like.

The process proceeds to the formation of an opening 30 with a high aspect ratio greater than about 5 in the substrate 100. In an embodiment of forming a TSV structure, the opening 30 is a TSV opening in which a metallization process will be performed. In defining the TSV opening 30, a hard mask layer 32 is formed over the substrate 100 followed by forming a patterned photoresist layer thereon. The hard mask layer 32 may be a silicon nitride layer, a silicon oxynitride layer or the like. The photoresist layer (not shown) is patterned by exposure, bake, developing, and/or other photolithography processes known in the art to provide an opening exposing the hard mask layer 32. The exposed hard mask layer 32 is then etched, by a wet etch or dry etch process, using the patterned photoresist layer as a masking element to provide an opening. Using the hard mask layer 32 and the patterned photoresist layer as mask elements, an etching process is performed to etch the exposed substrate 100, forming the TSV opening 30 with sidewalls 30*a* and a bottom 30*b*, passing through at least a portion of the substrate 100. The TSV opening 30 may be etched using any suitable etching method including, for example, a plasma etch, a chemical wet etch, a laser drill, and/or other processes known in the art. In an embodiment, the etching process includes a deep reactive ion etching (RIE) process to etch the substrate 100. The etching process may be such that the TSV opening 30 is etched from the front surface 100*a* to reach approximately from tens of micron to hundreds of micron in depth without passing through the back surface 100*b*. The etching process may result in a series of etched macro-scallops on the silicon substrate 100 adjacent to the sidewalls 30*a* of the TSV opening 30. The micro-scallop sidewalls will be smoothened in subsequent process. In an embodiment, the TSV opening 30 has a depth of approximately from 20 to 100 μm, and a diameter of approximately from 1.5 to 10 μm. The TSV opening 30 has a high aspect ratio between approximately 5 and approximately 10. In some embodiments, the aspect ratio of the TSV opening 30 is greater than 10. In creating the TSV opening 30 with a high aspect ratio in the silicon substrate 100, a series of etched macro-scallops (not shown) may be created on the sidewalls 30*a* of the silicon substrate 100, which can vary in size depending on process parameter. The micro-scallop sidewalls will be smoothened in subsequent thermal oxidation process.

With reference now to FIG. 4B, the process proceeds to the formation of the first insulation layer 12 on the silicon substrate 100 to cover the hard mask layer 32 and line the sidewalls 30*a* of the bottom 30*b* of the TSV opening 30. In one embodiment, the first insulation layer 12 is a thermal oxide layer grown by a high-temperature thermal oxidation process. In some embodiment, the thermal oxide layer is oxidized silicon (SiOx). The thermal oxide layer is grown on the entire substrate surface, and also grown on the sidewalls 30*a* and bottom 30*b* of the TSV opening 30 such that the thermal oxide layer smoothes the rough sidewalls of the initially etched opening 30. The interface 11 between the first insulation layer 12 and the silicon substrate 100 adjacent to the sidewall 30*a* is therefore smooth to achieve a roughness with a peak-to-valley height less than 5 nm. Compared to the interface 11, the exterior surface 13*a* of the first insulation layer 12 is relatively rough, which has a surface roughness with a peak-to-valley height greater than 10 nm. The thickness of the first insulation layer 12 can be controlled to optimize both electrical characteristics of the TSV such as capacitance and inductance.

With reference now to FIG. 4C, the process proceeds to the formation of the second insulation layer 14 on the silicon substrate 100, which may be formed on the first insulation layer 12. In one embodiment, the second insulation layer 14 is an oxide layer formed by SACVD process. The SACVD oxide layer is deposited on the entire surface of the first insulation layer 12 along the sidewalls 30*a* and bottom 30*b* of the TSV opening 30. The SACVD process is performed in a PECVD single wafer chamber, which is mechanically altered in order to handle high chamber pressures safely. The process runs without plasma and uses a mixture of TEOS (Tetra-Ethyl-Ortho-Silicate) and Ozone (O3) in a pressure range of 100-600 torr. Due to unique growing properties during SACVD deposition, the second insulation layer 14 has an exterior surface 15*a* that has a surface roughness with a peak-to-valley height less than 5 nm. Compared to the exterior surface 15*a*, the interface 13 between the first insulation layer 12 and the second insulation layer 14 is relatively rough, which has an interface roughness with a peak-to-valley height greater than 10 nm. In some embodiments, the second insulation layer 14 is an oxide layer formed by PECVD, PEALD, or future-developed deposition procedures to achieve a smooth surface with a peak-to-valley height less than 5 nm. The thickness of the second insulation layer 14 can be controlled to optimize both electrical characteristics of the TSV such as capacitance and inductance.

With reference now to FIG. 4D, the process proceeds to a metallization process for filling the TSV opening 30. Some embodiments provide the use of copper metallization in forming TSVs as well as the use of copper electroplating techniques to fill high aspect ratio openings to avoid a seam or void defect. As employed throughout this disclosure, copper (Cu) is intended to encompass elemental Cu as well as Cu-based alloys substantially exhibiting the electrical properties of Cu. In order to avoid diffusion of metal from the TSV metal into the silicon substrate, a barrier layer is used between the insulation layer and the TSV metal.

A barrier layer 18 is formed on the second insulation layer 14, lining the TSV opening 30. The barrier layer 18 functions as a diffusion barrier to prevent metal diffusion and as an adhesion layer between metal and dielectric. Refractory metals, refractory metal-nitrides, refractory metal-silicon-nitrides and combinations thereof are typically used for the barrier layer 18. For example, TaN, Ta, Ti, TiN, TiSiN, WN, or combinations thereof may be used. In some embodiments, the barrier layer 18 includes a TaN layer and a Ta layer. In some embodiments, the barrier layer 18 is a TiN layer. In some embodiments, the barrier layer 18 is a Ti layer.

A metal seed layer (not shown) is then formed on the barrier layer 18. In some embodiments, the metal seed layer is a copper seed layer that may be formed by physical vapor deposition. Other methods for forming copper seed layers, such as CVD are known in the art. The wafer 2 is then transferred to a plating tool, such as an electrochemical plating (ECP) tool, and a conductive layer 20 is plated on the wafer 2 by the plating process to fill the TSV opening 30. While ECP process is described herein, the embodiment is not limited to ECP deposited metal. The conductive layer 20 may include a low resistivity conductor material selected from the group of conductor materials including, but not limited to, copper and copper-based alloy. Alternatively, the conductive layer may comprise various materials, such as tungsten, aluminum, gold, silver, and the like. In an embodiment, the conductive layer 20 is a copper-containing layer formed over the copper seed layer. The interface surface 15 between the barrier layer 18 and the second insulation layer 14 is smooth that has an interface roughness with a peak-to-valley height less than 5 nm.

Subsequently, as shown in FIG. 4E, the excess portions of the conductive layer 20, the metal seed layer, the barrier layer 18, the second insulation layer 14, the first insulation layer 12, and/or the hard mask layer 32 outside the TSV opening 30 are removed, either through etching, chemical mechanical polishing (CMP), or the like, forming the upper surface of the metal-filled opening substantially coplanar with the upper surface of substrate 100. The remaining portions of the conductive layer 20 and the barrier layer 18 in the TSV opening 30 form the TSV structure 10A. The remaining portions of the second insulation layer 14 and the first insulation layer 12 in the TSV opening 30 become the sidewall insulation structure 16, which is sandwiched between the TSV structure 10A and the silicon substrate 100.

Next, the wafer 2 undergoes back-end-of-line (BEOL) interconnection processes, a wafer thinning process and a backside metallization process. The dies 200 and 300 can be bonded to the silicon substrate 100 by flip-chip bonding. After dicing, the stacked dies are mounted on an IC card by, for example, an anisotropically conductive connection film.

FIGS. 5A-5D are cross-sectional views of a portion of a wafer at various stages of its fabrication according to an embodiment of the interconnect structure of FIG. 2B and the method 600 of FIG. 3. The explanation of the same or similar portions to the description in FIGS. 4A-4E will be omitted.

Figure 5A:
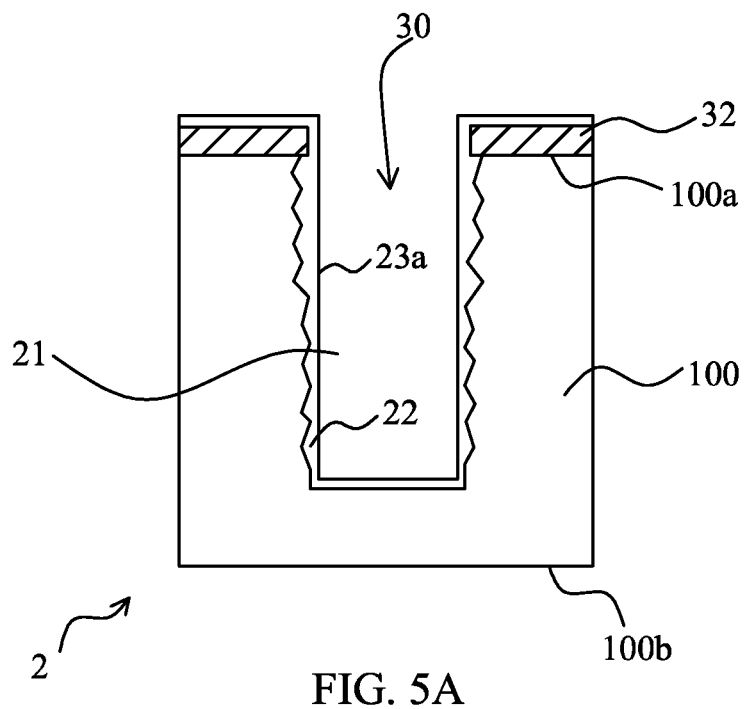
FIGS. 5A-5D are cross-sectional views of a portion of a wafer at various stages of fabrication according to an embodiment of the interconnect structure of FIG. 2B and the method of FIG. 3.

FIG. 5A is a cross-sectional diagram of the wafer 2 comprising the silicon substrate 100. The silicon substrate 100 has a front surface 100a and a back surface 100b. The process proceeds to the formation of a TSV opening 30 with a high aspect ratio greater than about 5 in the silicon substrate 100 by using the hard mask layer 32, and a wet etch or dry etch process. A series of etched macro-scallops may be created on the silicon substrate 100 adjacent to the sidewalls 30a of the TSV opening 30. The micro-scallop sidewalls will be smoothed in subsequent thermal oxidation processes. The process proceeds to the formation of a first insulation layer 22 on the silicon substrate 100 to cover the hard mask layer 32 and line the sidewalls 30a of the bottom 30b of the TSV opening 30. In one embodiment, the first insulation layer 22 is an oxide layer formed by SACVD process. The SACVD oxide layer is deposited on the entire silicon surface along the sidewalls 30a and bottom 30b of the TSV opening 30. Due to unique growing properties during SACVD deposition, the first insulation layer 22 can have an exterior surface 23a that is smoothed to achieve a surface roughness with a peak-to-valley height less than 5 nm. Compared to the exterior surface 23a, the interface 21 between the first insulation layer 22 and the silicon substrate 100 adjacent to the sidewalls 30a is relatively rough, which has an interface roughness with a peak-to-valley height greater than 10 nm. In some embodiments, the first insulation layer 22 is an oxide layer formed by PECVD, PEALD, or future-developed deposition procedures to achieve a smooth exterior surface with a peak-to-valley height less than 5 nm. In some embodiments, the thickness of the first insulation layer 22 is controlled to optimize both electrical characteristics of the TSV such as capacitance and inductance.

Figure 5B:
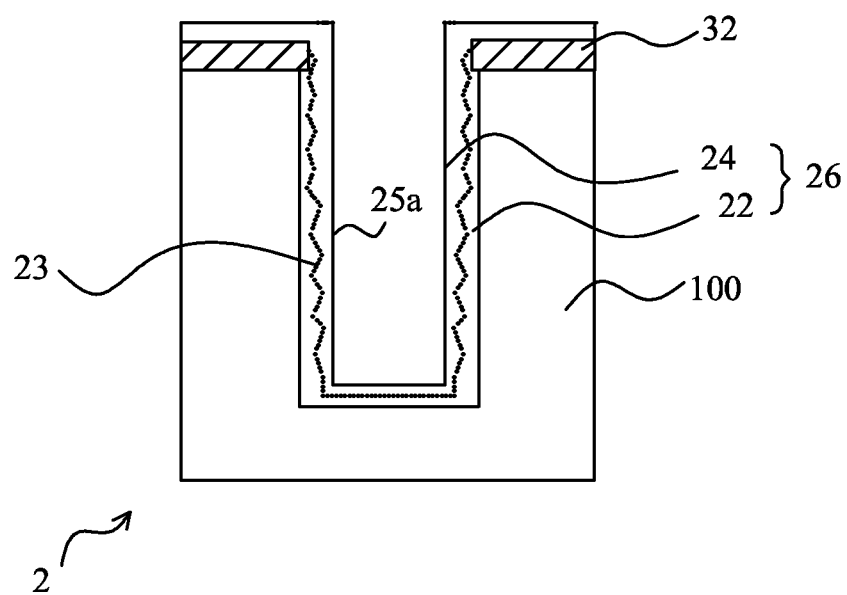

With reference now to FIG. 5B, the process proceeds to the formation of the second insulation layer 24 on the silicon substrate 100, which is formed on or under the first insulation layer 22. In one embodiment, the second insulation layer 24 is a thermal oxide layer grown by a high-temperature thermal oxidation process. In some embodiments, the thermal oxide layer is oxidized silicon (SiOx). The thermal oxide layer has an exterior surface 25a that is smooth to achieve a surface roughness with a peak-to-valley height less than 5 nm. The thermal oxide layer is grown on the entire surface 23a of the first insulation layer 22 along the sidewalls 30a and bottom 30b of the TSV opening 30 such that the high-temperature cycles in the thermal oxidation process can improve the film properties of the first insulation layer 22 to make the two layers 22 and 24 have similar film properties, for example similar isotropic etching rates in the same wet-etching solution. Thus, the rough surface 23a, referred as to an interface 23 (shown as a dotted line) between the first insulation layer 22 and the second insulation layer 24 is eliminated. The two layers 22 and 24 form the insulation structure 26 and it is difficult to observe the interface 23 therein. In some embodiments, the two insulation layers 22 and 24 becomes one thermal oxide film. The thickness of the second insulation layer 24 can be controlled to optimize both electrical characteristics of the TSV such as capacitance and inductance.

Figure 5C:
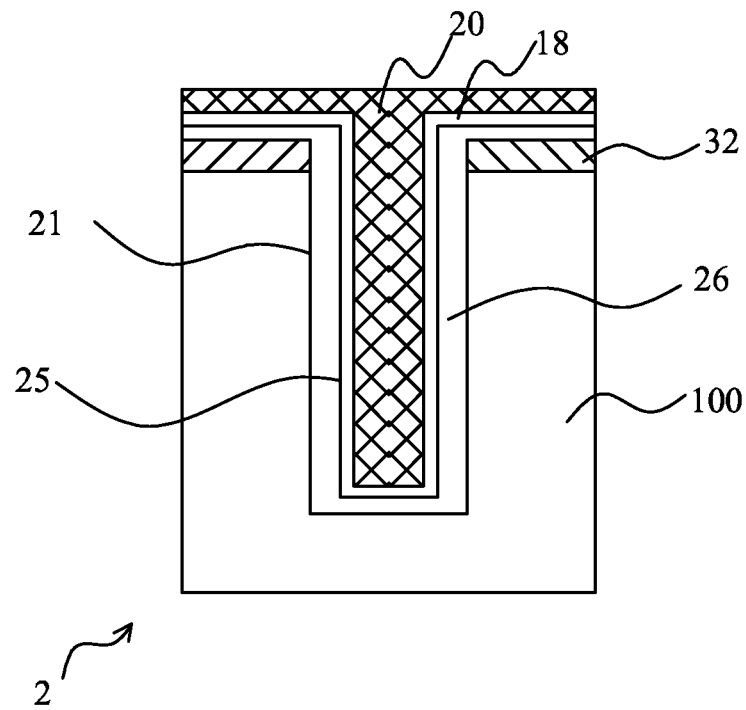

With reference now to FIG. 5C, the process proceeds to a metallization process for filling the TSV opening 30. A barrier layer 18 is formed on the second insulation layer 24, lining the TSV opening 30. The barrier layer 18 functions as a diffusion barrier to prevent metal diffusion and as an adhesion layer between metal and dielectric. Refractory metals, refractory metal-nitrides, refractory metal-silicon-nitrides and combinations thereof are typically used for the barrier layer 18. For example, TaN, Ta, Ti, TiN, TiSiN, WN, or combinations thereof may be used. In some embodiments, the barrier layer 18 includes a TaN layer and a Ta layer. In some embodiments, the barrier layer 18 is a TiN layer. In some embodiments, the barrier layer 18 is a Ti layer. A metal seed layer (not shown) is then formed on the barrier layer 18. In some embodiments, the metal seed layer is a copper seed layer that may be formed by physical vapor deposition. Other methods for forming copper seed layers, such as CVD are known in the art. The wafer 2 is then transferred to a plating tool, such as an electrochemical plating (ECP) tool, and a conductive layer 20 is plated on the wafer 2 by the plating process to fill the TSV opening 30. While ECP process is described herein, the embodiment is not limited to ECP deposited metal. In some embodiments, the conductive layer 20 includes a low resistivity conductor material selected from the group of conductor materials including, but is not limited to, copper and copper-based alloy. Alternatively, the conductive layer may comprise various materials, such as tungsten, aluminum, gold, silver, and the like. In an embodiment, the conductive layer 20 is a copper-containing layer formed over the copper seed layer.

Figure 5D:
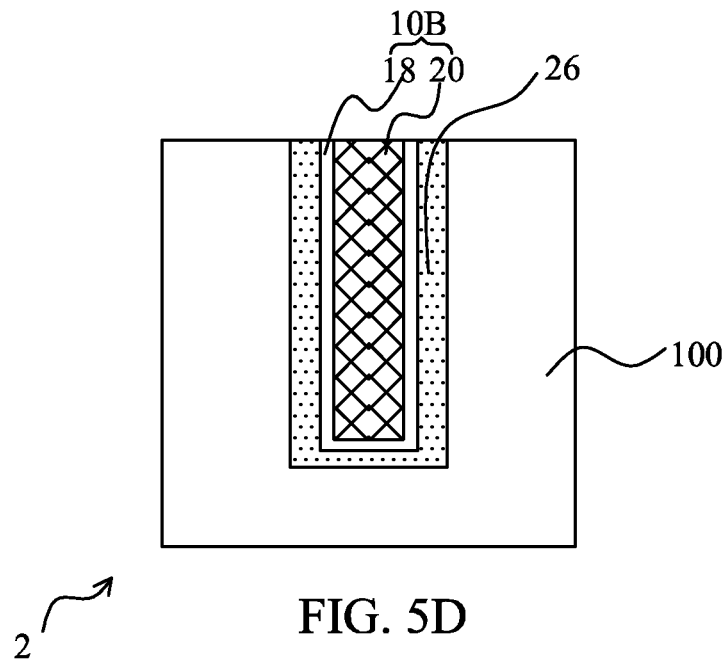

Subsequently, as illustrated in FIG. 5D, the excess portions of the conductive layer 20, the metal seed layer, the barrier layer 18, the second insulation layer 24, the first insulation layer 22, and/or the hard mask layer 32 outside the TSV opening 30 are removed, either by etching, chemical mechanical polishing (CMP), or the like, forming the upper surface of the metal-filed opening substantially coplanar with the upper surface of substrate 100. The remaining portions of the conductive layer 20 and the barrier layer 18 in the TSV opening 30 form the TSV structure 10B. The remaining portions of the second insulation layer 24 and the first insulation layer 22 in the TSV opening 30 become the sidewall insulation structure 26, which is sandwiched between the TSV structure 10B and the silicon substrate 100.

Next, the wafer 2 undergoes back-end-of-line (BEOL) interconnection processes, a wafer thinning process and a backside metallization process. The dies 200 and 300 can be bonded to the silicon substrate 100 by flip-chip bonding. After dicing, the stacked dies are mounted on an IC card by, for example, an anisotropically conductive connection film.

In the preceding detailed description, the disclosure is described with reference to specific exemplary embodiments thereof. It will, however, be evident that various modifications, structures, processes and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A device, comprising:
a silicon substrate having a first surface and a second surface opposite the first surface;
a through-silicon via (TSV) structure passing through the silicon substrate from the first surface to the second surface; and
an insulation structure formed between the silicon substrate and the TSV structure,
wherein a first interface between the insulation structure and the silicon substrate from the first surface to the second surface has an interface roughness with a peak-to-valley height less than 5 nm, and a second interface between the insulation structure and the TSV structure from the first surface to the second surface has an interface roughness with a peak-to-valley height less than 5 nm.

2. The device of claim 1, wherein the insulation structure comprises a first insulation layer adjacent to the silicon substrate, and a second insulation layer adjacent to the TSV structure.

3. The device of claim 2, wherein the second insulation layer has an isotropic etching rate in a diluted hydrofluoric acid solution greater than an isotropic etching rate of the first insulation layer in the diluted hydrofluoric acid solution.

4. The device of claim 2, wherein a third interface between the first insulation layer and the second insulation layer has an interface roughness with a peak-to-valley height greater than 10 nm.

5. The device of claim 2, wherein the first insulation layer is an oxide layer, and the second insulation layer is an oxide layer.

6. The device of claim 1, wherein the TSV structure comprises a copper layer.

7. The device of claim 6, wherein the TSV structure comprises a diffusion barrier layer surrounding the copper layer.

8. The device of claim 1, further comprising a first die electrically coupled to a first side of the silicon substrate.

9. The device of claim 8, further comprising a second die electrically coupled to a second side of the silicon substrate, opposite to the first side of the silicon substrate.

10. A three dimensional integrated circuit (3D-IC) comprising:
a first substrate having a first surface and a second surface opposite the first surface;
a through-silicon via (TSV) structure passing through the first substrate from the first surface to the second surface;
an insulation structure formed between the silicon substrate and the TSV structure,
wherein a first interface between the insulation structure and the silicon substrate from the first surface to the second surface has an interface roughness with a peak-to-valley height less than 5 nm, and a second interface between the insulation structure and the TSV structure from the first surface to the second surface has an interface roughness with a peak-to-valley height less than 5 nm; and
a second substrate electrically connected to the first substrate.

11. The 3D-IC of claim 10, wherein the insulation structure comprises a first insulation layer adjacent to the first substrate, and a second insulation layer adjacent to the TSV structure.

12. The 3D-IC of claim 11, wherein the second insulation layer has an isotropic etching rate in a diluted hydrofluoric acid solution greater than an isotropic etching rate of the first insulation layer in the diluted hydrofluoric acid solution.

13. The 3D-IC of claim 11, wherein a third interface between the first insulation layer and the second insulation layer has an interface roughness with a peak-to-valley height greater than 10 nm.

14. The 3D-IC of claim 10, further comprising:
a first die electrically coupled to a first side of the silicon substrate; and
a second die electrically coupled to a second side of the silicon substrate, opposite to the first side of the silicon substrate.

15. The 3D-IC of claim 14, further comprising an encapsulant over the first die.

16. The 3D-IC of claim 10, wherein the TSV structure comprises a copper layer and a diffusion barrier layer surrounding the copper layer.

17. The 3D-IC of claim 16, wherein the diffusion barrier layer comprises at least one of TaN, Ta, Ti, TiN, TiSiN or WN.

18. The 3D-IC of claim 10, wherein the insulation structure has a thickness ranging from about 50 nm to about 5 µm.

19. A device, comprising:
a silicon substrate having a first surface and a second surface opposite the first surface;
a through-silicon via (TSV) structure passing through the silicon substrate from the first surface to the second surface; and
an insulation structure formed between the silicon substrate and the TSV structure,
wherein the insulation structure comprises a first insulating layer and a second insulating layer, and an interface between the first insulating layer and the second insulating layer from the first surface to the second surface has an interface roughness with a peak-to-valley height greater than 10 nm.

20. The device of claim 18, wherein a first interface between the insulation structure and the silicon substrate has an interface roughness with a peak-to-valley height less than 5 nm, and a second interface between the insulation structure and the TSV structure has an interface roughness with a peak-to-valley height less than 5 nm.

21. The device of claim 18, wherein the insulation structure has a thickness ranging from about 50 nm to about 5 µm.

\* \* \* \* \*